(12) United States Patent
Jiwari et al.

(10) Patent No.: US 6,787,445 B1
(45) Date of Patent: Sep. 7, 2004

(54) METHOD FOR FABRICATING SEMICONDUCTOR DEVICE

(75) Inventors: Nobuhiro Jiwari, Katano (JP); Shinichi Imai, HiraKata (JP)

(73) Assignee: Matsushita Electric Industry Co., Ltd., Osaka (JP)

(*) Notice: Subject to any disclaimer, the term of this patent is extended or adjusted under 35 U.S.C. 154(b) by 0 days.

(21) Appl. No.: 09/708,085

(22) Filed: Nov. 8, 2000

(30) Foreign Application Priority Data

Nov. 10, 1999 (JP) .......................................... 11-319087

(51) Int. Cl.$^7$ ...................... H01L 21/4763; H01L 21/31

(52) U.S. Cl. ...................... 438/623; 438/788; 438/789; 438/790

(58) Field of Search ................................ 438/623–624, 438/700, 782, 788–790

(56) References Cited

U.S. PATENT DOCUMENTS

| | | | | |
|---|---|---|---|---|
| 5,420,075 A | * | 5/1995 | Homma et al. | 438/624 |
| 6,214,748 B1 | * | 4/2001 | Kobayashi et al. | 438/782 |
| 6,218,299 B1 | * | 4/2001 | Akahori et al. | 438/682 |
| 6,468,603 B1 | * | 10/2002 | Endo et al. | 427/577 |

FOREIGN PATENT DOCUMENTS

JP           10-199976         7/1998

* cited by examiner

*Primary Examiner*—Thanh Nguyen
(74) *Attorney, Agent, or Firm*—Nixon Peabody LLP; Donald R. Studebaker

(57) ABSTRACT

A fluorine-containing organic film is deposited on a semiconductor substrate using a material gas containing fluorocarbon as a main component in a reactor chamber of a plasma processing apparatus. The fluorine-containing organic film is then exposed to plasma of a rare gas in the same reactor chamber to densify the fluorine-containing organic film.

7 Claims, 4 Drawing Sheets

METHOD FOR FABRICATING SEMICONDUCTOR DEVICE

BACKGROUND OF THE INVENTION

The present invention relates to a method for fabricating a semiconductor device that includes a fluorine-containing organic film having a low relative dielectric constant.

With recent remarkable progress in semiconductor process technology, finer semiconductor elements and metal interconnections with higher integration have been pursued. With this trend toward finer size and higher integration, signal delay at metal interconnections has come to greatly influence the operation speed of semiconductor integrated circuit in the above situation, desired is a technique of forming a fluorine-containing organic film (fluorocarbon film) that contains carbon atoms and fluorine atoms as main components and has a relative dielectric constant lower than that of an inorganic film such as a $SiO_2$ film or a SiOF film.

A fluorine-containing organic film has a relative dielectric constant of about 2, which is lower than the relative dielectric constant of a SiOF film (about 3.5 to about 3.8). Accordingly, by depositing such a fluorine-containing organic film between metal interconnections or on the top surfaces of metal interconnections, signal delay at the metal interconnections can be reduced.

However, the fluorine-containing organic film deposited using a material gas containing fluorine described above is disadvantageously poor in denseness and thus insufficient in mechanical strength, heat resistance, chemical resistance, and the like.

In order to solve the above problem, Japanese Laid-Open Patent Publication No. 10-199976 proposes a method for densifying a fluorine-containing organic film to improve oxidation resistance and heat resistance in the following manner. A copolymer of a polytetrafluoroethylene resin or a cyclic fluorine resin and siloxane is dissolved in a fluorocarbon solvent. The resultant solution is applied to a substrate while rotating, to obtain a fluorine-containing organic film. The resultant fluorine-containing organic film is then subjected to annealing where the film is kept in an atmosphere of an inert gas such as nitrogen gas at a temperature of 400° C. for 30 minutes.

The above conventional method has the following problems. After a fluorine-containing organic film is formed in a film formation apparatus such as a rotary application apparatus, the resultant substrate with the fluorine-containing organic film formed thereon must be transported from the film formation apparatus to an annealing apparatus for densifying the film by annealing. This complicates the process, and moreover arises the following problems. Particles may attach to the substrate during the transportation, resulting in lowering the yield. Also, the fluorine-containing organic film may absorb water in the atmosphere, and the absorbed water may react with free fluorine atoms in the film, forming hydrofluoric acid. The hydrofluoric acid may corrode metal interconnections.

SUMMARY OF THE INVENTION

In view of the above, the object of the present invention is allowing a fluorine-containing organic film to be densified without the necessity of transporting a substrate with the fluorine-containing organic film formed thereon from a film formation apparatus to another processing apparatus.

In order to attain the above object, the first method for fabricating a semiconductor device of the present invention includes the steps of: depositing a fluorine-containing organic film on a semiconductor substrate using a material gas containing fluorocarbon as a main component in a reactor chamber of a plasma processing apparatus; and densifying the fluorine-containing organic film by exposing the fluorine-containing organic film to plasma of a rare gas in the same reactor chamber.

According to the first method for fabricating a semiconductor device, the step of depositing a fluorine-containing organic film on a semiconductor substrate and the step of densifying the deposited fluorine-containing organic film are performed in the same reactor chamber. This eliminates the necessity of transporting the semiconductor substrate to an annealing apparatus for densifying. As a result, the number of process steps required is reduced. In addition, the possibility of attachment of particles during the transportation and thus reduction in yield is avoided.

In the first fabrication method, the step of depositing a fluorine-containing organic film preferably includes the step of depositing the fluorine-containing organic film while cooling the semiconductor substrate. This improves the deposition rate of the fluorine-containing organic film.

In the first fabrication method, the step of densifying the fluorine-containing organic film preferably includes the step of exposing the fluorine-containing organic film to the plasma of a rare gas in a state where the semiconductor substrate has moved toward a plasma generation region in the reactor chamber. This facilitates densifying of the fluorine-containing organic film.

The second method for fabricating a semiconductor device of the present invention includes the steps of: forming a mask pattern made of a resist film or an insulating film on a metal film deposited on a semiconductor substrate; dry-etching the metal film using the mask pattern to form a plurality of metal interconnections made of the metal film; depositing an interlayer insulating film made of a fluorine-containing organic film between the plurality of metal interconnections and on top surfaces of the metal interconnections using a material gas containing fluorocarbon as a main component in a reactor chamber of a plasma processing apparatus; and densifying the fluorine-containing organic film by exposing the fluorine-containing organic film to plasma of a rare gas in the same reactor chamber.

According to the second method for fabricating a semiconductor device, as in the first fabrication method, the necessity of transporting the semiconductor substrate to an annealing apparatus for densifying is eliminated. This reduces the number of process steps required. In addition, the problem of attachment of particles during the transportation and thus reduction in yield is avoided.

Moreover, according to the second fabrication method, since the necessity of transporting the semiconductor substrate to an annealing apparatus for densifying is eliminated, it is possible to avoid the problem that the fluorine-containing organic film may absorb water in the atmosphere and absorbed water may react with free fluorine atoms existing in the film, forming hydrofluoric acid. Thus, an occurrence of corrosion of metal interconnections with the hydrofluoric acid is prevented.

In the second fabrication method, the step of forming a mask pattern preferably includes the steps of: depositing the insulating film on the metal film; forming a resist pattern on the insulating film; and dry-etching the insulating film using the resist pattern to form the mask pattern, and the step of dry-etching the insulating film is performed in the same reactor chamber.

The step of dry-etching the insulating film is performed in the same reactor chamber as the step of depositing a fluorine-containing organic film and the step of densifying the fluorine-containing organic film. This further reduces the number of process steps and also the possibility of attachment of particles.

In the first or second fabrication method, the fluorocarbon is preferably. $C_5F_8$, $C_3F_6$, or $C_4F_6$.

All of $C_5F_8$ gas, $C_3F_6$ gas, and $C_4F_6$ gas have carbon-to-carbon double bonds. During film formation, carbon-to-carbon double bonds are dissociated, and resultant carbon atoms are bound with free fluorine atoms. This reduces the number of free fluorine atoms in the fluorine-containing organic film. The resultant deposited fluorine-containing organic film is denser than a fluorine-containing organic film deposited using any of other fluorocarbon gases. In addition, $C_5F_8$ gas, $C_3F6$ gas, and $C_4F_6$ gas are short in atmospheric life and small in $GWP_{100}$, and therefore do not easily cause global warming.

In the first or second fabrication method, the rare gas is preferably argon gas.

Argon gas is often added to a material gas for film formation since the deposition rate improves by adding argon gas to the material gas. Therefore, by using plasma of argon gas for densifying, the same rare gas can be used for both the film formation process and the densifying process. This makes easy to perform the film formation process and the densifying process in the same reactor chamber.

DESCRIPTION OF THE PREFERRED EMBODIMENTS

Hereinafter, an embodiment of the method for fabricating a semiconductor device of the present invention will be described. First, as a precondition, a plasma processing apparatus used for this fabrication method will be described with reference to FIG. 1.

Figure 1:
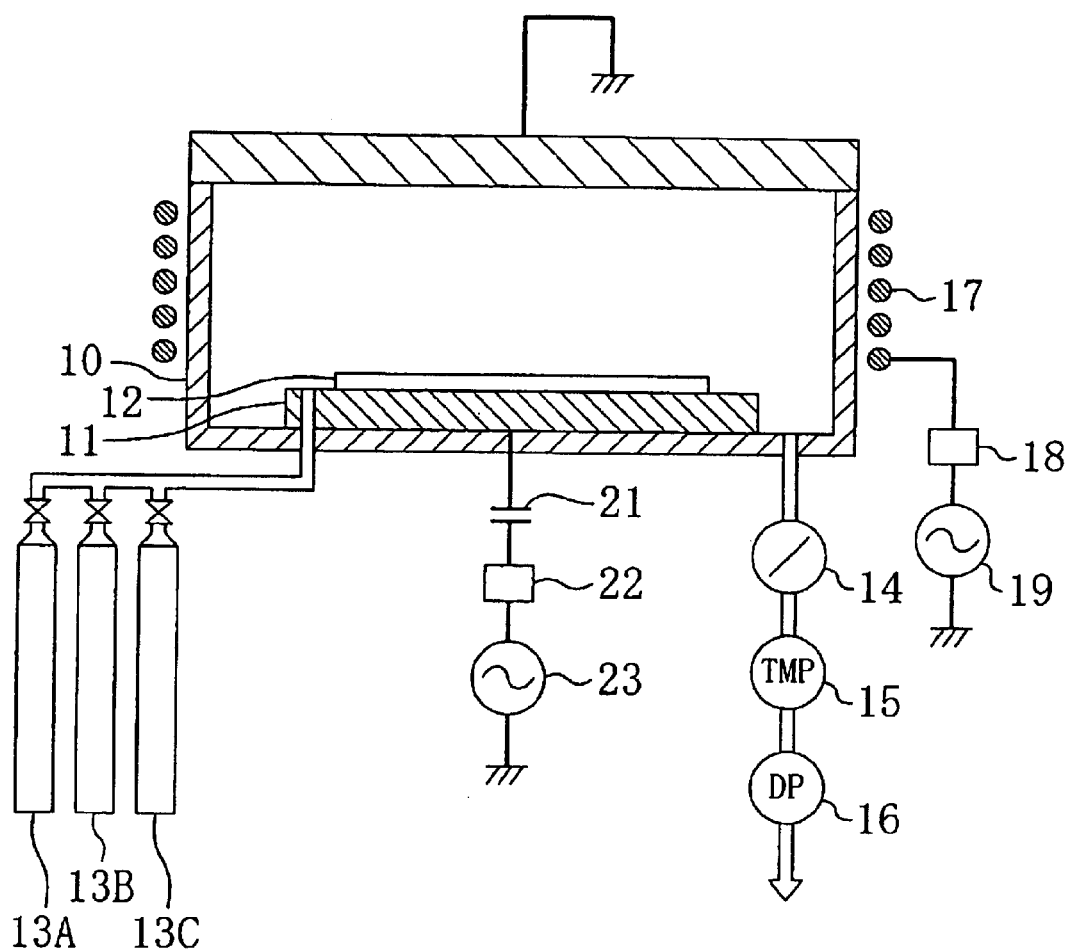
FIG. 1 is a cross-sectional view of the entire construction of an inductively coupled plasma processing apparatus used for the method for fabricating a semiconductor device of an embodiment of the present invention.

FIG. 1 is a schematic cross-sectional structure of an inductively coupled plasma processing apparatus where a bottom electrode 11 as a sample stage is disposed on the bottom of a reactor chamber 10 and holds a semiconductor substrate 12 thereon.

To the reactor chamber 10, connected are a first gas bottle 13A, a second gas bottle 13B, and a third gas bottle 13C for supply of $C_5F_8$ gas, Ar gas, and $O_2$ gas, respectively, so that $C_5F_8$ gas, Ar gas, and $O_2$ gas are introduced into the reactor chamber 10 at controlled flow rates from the first, second, and third gas bottles 13A, 13B, and 13C. The reactor chamber 10 is also provided with a gas exhaust means essentially composed of an outlet open/close valve 14, a turbo molecular pump (TMP) 15, and a dry pump (DP) 16.

A columnar coil 17 is wound around the outer circumference of a sidewall of the reactor chamber 10. An end of the columnar coil 17 is connected to a first high-frequency power source 19 via a first matching circuit 18, and the other end of the columnar coil 17 is connected to the sidewall of the reactor chamber 10 and thus grounded. Once a high-frequency power is applied to the columnar coil 17 from the first high-frequency power source 19, a high-frequency inductive electromagnetic field is generated in the reactor chamber 10, whereby the $C_5F_8$ gas, the Ar gas, and the $O_2$ gas in the reactor chamber 10 are changed to plasma. A second high-frequency power source 23 is connected to the bottom electrode 11 via a capacitor 21 and a second matching circuit 22. Once a high-frequency power is applied to the bottom electrode 11 from the second high-frequency power source 23, particles generated in the reactor chamber 10 move toward the bottom electrode 11, that is, toward the semiconductor substrate 12.

Hereinafter, an embodiment of the method for fabricating a semiconductor device of the present invention, which uses the inductively coupled plasma processing apparatus described above, will be described with reference to FIGS. 1 and 2(a) through 2(e).

Figure 2A:
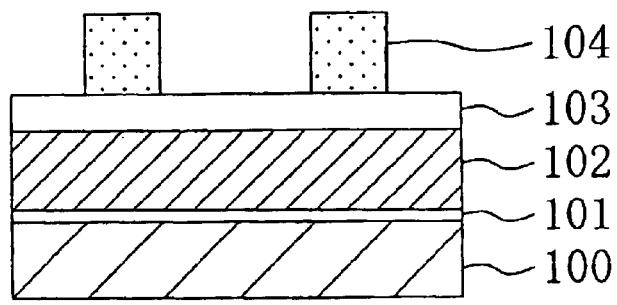
FIGS. 2(a) through 2(e) are cross-sectional views illustrating steps of the method for fabricating a semiconductor device of the embodiment of the present invention.

First, as shown in FIG. 2(a), formed sequentially on a semiconductor substrate 100 made of silicon are: a first silicon oxide film 101 made of a thermally oxidized film, for example; a metal film 102 made of aluminum or copper, for example; and a second silicon oxide film 103 made of TEOS, for example. Thereafter, a resist film is applied to the surface of the second silicon oxide film 103, and then subjected to a known photolithographic process to form a resist pattern 104 having a shape corresponding to a wiring having a shape corresponding to a wiring pattern. The resultant semiconductor substrate 100 is mounted on the bottom electrode 11 of the plasma processing apparatus shown in FIG. 1 and held thereon by static adsorption.

Subsequently, to the reactor chamber 10 shown in FIG. 1, introduced are $C_5F_8$ gas from the first gas bottle 13A, Ar gas from the second gas bottle 13B, and $O_2$ gas from the third gas bottle 13C. Simultaneously, a first high-frequency power of 400 to 3000 W having a frequency of 2.0 MHz, for example, is applied to the columnar coil 17 from the first high-frequency power source 19, to generate $C_5F_8/Ar/O_2$ plasma in the reactor chamber 10. The mixture ratio of the $C_5F_8$ gas to the Ar gas is preferably in the range of 1:4 to 1:300 in volume flow rate, and the $O_2$ gas is preferably mixed in an amount of 5 vol. % or more with respect to the flow rate of the $C_5F_8$ gas.

Figure 2B:
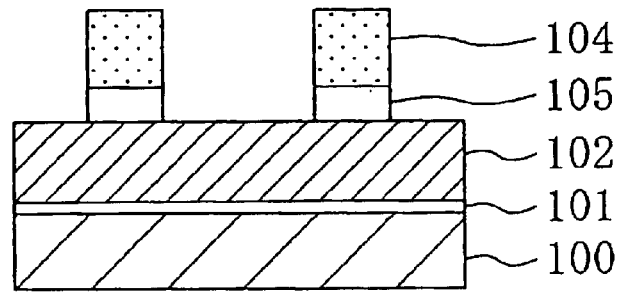

A second high-frequency power of 0.5 to 7.0 W/cm$^2$ (power per wafer area of 1 cm$^2$) having a frequency of 1.8 MHz, for example, is applied to the bottom electrode 12 from the second high-frequency power source 23, to attract etching species in the $C_5F_8/Ar/O_2$ plasma to the semiconductor substrate 100. This enables the second silicon oxide film 103 to be selectively dry-etched, thereby forming a hard mask 105 made of the second silicon oxide film 103 as shown in FIG. 2(b).

Figure 2C:
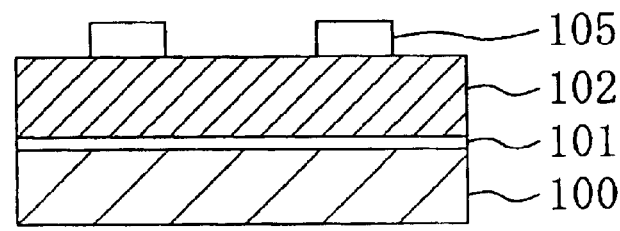

The supply of the $C_5F_8$ gas and the Ar gas is then stopped, while the flow rate of the $O_2$ gas is increased, to generate $O_2$ plasma in the reactor chamber 10. With the $O_2$ plasma, the resist pattern 104 is removed with ashing as shown in FIG. 2(c).

Figure 2D:
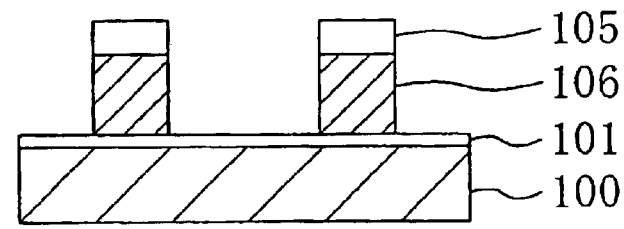

Although not shown, the connection is switched from the first, second, and third gas bottles 13A, 13B, and 13C to another gas bottle containing known etching gas such as $Cl_2$ gas, $CHF_3$ gas, $BCl_3$ gas, or the like to introduce such gas into the reactor chamber 10. With the etching gas, the metal film 102 is dry-etched using the hard mask 105 as a mask, to form metal interconnections 106 made of the metal film 102 as shown in FIG. 2(d).

Thereafter, the connection of the gas bottles is switched to the first and second gas bottles 13A and 13B, to introduce the $C_5F_8$ gas and the Ar gas. Simultaneously, the first high-frequency power of 400 to 3000 W having a frequency of 2.0 MHz, for example, is applied to the columnar coil 17 from the first high-frequency power source 19, to generate $C_5F_8$/Ar plasma in the reactor chamber 10. The mixture ratio of the $C_5F_8$ gas to the Ar gas is preferably in the range of 1:1 to 1:10 in volume flow rate. The $O_2$ gas may not be mixed, or may be mixed to some extent depending on the deposition condition.

Figure 2E:
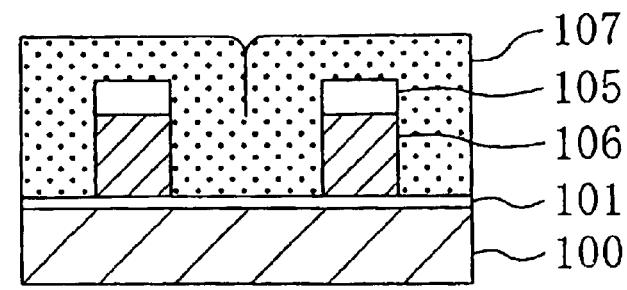

The second high-frequency power of 0 to 7.0 $W/cm^2$ having a frequency of 1.8 MHz, for example, is applied (the second high-frequency power may not be applied) to the bottom electrode 12 from the second high-frequency power source 23. As a result, a fluorine-containing organic film 107 having a relative dielectric constant of 4 or less, which is to be an interlayer insulating film, is deposited over the entire surface of the resultant semiconductor substrate 100 as shown in FIG. 2(e).

Thereafter, the supply of the $C_5F_8$ gas from the first gas bottle 13A is stopped, while the supply of the Ar gas from the second gas bottle 13B is continued. Simultaneously, the first high-frequency power of 400 to 3000 w having a frequency of 2.0 MHz, for example, is applied to the columnar coil 17 from the first high-frequency power source 19, and the second high-frequency power of 0 to 7.0 $W/cm^2$ having a frequency of 1.8 MHz, for example, is applied to the bottom electrode 12 from the second high-frequency power source 23. In this way, the fluorine-containing organic film 107 is exposed to Ar plasma. The amount of the Ar gas supplied is not specified, but is preferably about 180 mL/min as the volume flow rate per minute in the standard conditions.

By being exposed to Ar plasma, the fluorine-containing organic film 107 is heated with radiant heat of the plasma, raising the temperature of the film to as high as about 300° C. By keeping the temperature of about 300° C. for about 30 seconds, the fluorine-containing organic film 107 is densified.

Figure 3A:
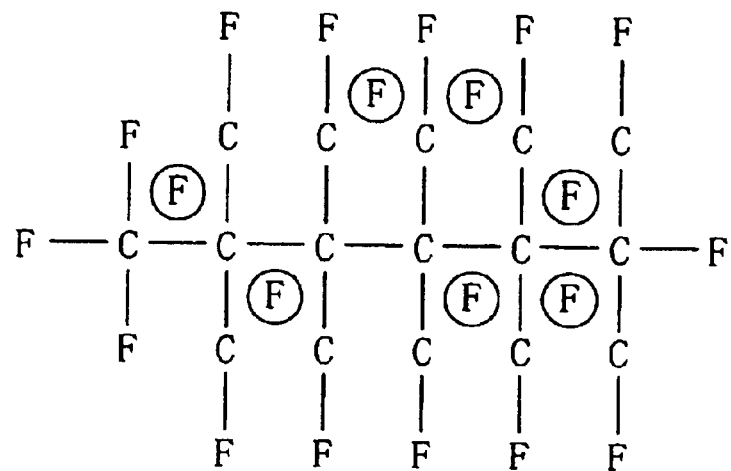
FIGS. 3(a) and 3(b) illustrate polymer structures of a fluorine-containing organic film before and after exposure to plasma, respectively.
Figure 3B:
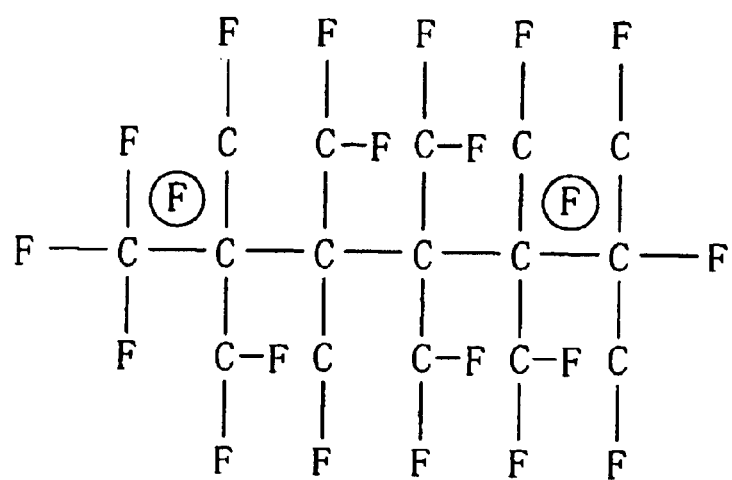

FIGS. 3(a) and 3(b) illustrate polymer structures of a fluorine-containing organic film before and after exposure to Ar plasma, respectively. As is apparent from comparison between FIGS. 3(a) and 3(b), when a fluorine-containing organic film is exposed to Ar plasma, the temperature of the fluorine-containing organic film rises, allowing free fluorine atoms existing in the polymer structure to be bound with carbon atoms. This reduces the number of free fluorine atoms and thus densifies the fluorine-containing organic film 107.

In this embodiment, the process of depositing the fluorine-containing organic film 107 on the semiconductor substrate 100 using a fluorocarbon gas (e.g., $C_5F_8$ gas) and the process of exposing the deposited fluorine-containing organic film 107 to plasma of a rare gas (e.g., Ar gas) to densify the film are performed in the same reactor chamber 10. This eliminates the necessity of transporting the semiconductor substrate 100 from a film formation apparatus to an annealing apparatus for densifying. As a result, the number of process steps required is reduced. Also, the possibility of attachment of particles during the transportation and thus reduction in yield is avoided. In addition, avoided is the problem that the fluorine-containing organic film 107 may absorb water in the atmosphere and absorbed water may react with free fluorine atoms existing in the film, forming hydrofluoric acid. Thus, an occurrence of corrosion of metal interconnections with the hydrofluoric acid is prevented.

Furthermore, in this embodiment, the $C_5F_8$ gas known as an etching gas is also used as a material gas for film formation. It is therefore possible to perform the process of selectively dry-etching the second silicon oxide film 103 to form the hard mask 105 and the process of depositing the fluorine-containing organic film 107 in the same reactor chamber 10. This further reduces the number of process steps and further avoids the possibility of attachment of particles during the transportation.

A In this embodiment, the temperature of the bottom electrode 11 was not specified in particular. During deposition, however, if the temperature of the bottom electrode 11 is lowered to lower the temperature of the semiconductor substrate 100, the deposition rate increases. With an increased deposition rate., the fluorine-containing organic film 107 can be formed efficiently.

Therefore, in the process of depositing the fluorine-containing organic film 107, the bottom electrode 11 is preferably cooled to keep the semiconductor substrate 100 at a low temperature. However, when the semiconductor substrate 100 is kept at a low temperature, the efficiency decreases in the process of exposing the fluorine-containing organic film 107 to Ar plasma to densify the film. To overcome the above problem, in the process of densifying the film, upthrust pins (not shown) normally provided for the bottom electrode 11 are preferably thrust up to lift the semiconductor substrate 100 held on the bottom electrode 11 by about several centimeters from the bottom electrode 11. By this lifting, the semiconductor substrate 100 is detached from the cooled bottom electrode 11 and at the same time pushed closer to a plasma generation region. In this way, the fluorine-containing organic film 107 can be obtained efficiently by deposition at a low temperature, and also the resultant fluorine-containing organic film 107 can be densified by being brought closer to the plasma generation region.

As a material gas for deposition of the fluorine-containing organic film 107, $CF_4$ gas, $C_2F_6$ gas, $C_3F_6$ gas, $C_4F_6$ gas, or $C_4F_8$ gas may be used in place of $C_5F_8$ gas. However, $C_5F_8$ gas, $C_3F_6$ gas, and $C_4F_8$ gas are preferable to other perfluorocarbon gases for the following reason. All of $C_5F_8$ gas, $C_3F_6$ gas, and $C_4F_8$ gas have carbon-to-carbon double bonds. During film formation, carbon-to-carbon double bonds are dissociated, and resultant carbon atoms are bound with free fluorine atoms. This reduces the number of free fluorine atoms in the fluorine-containing organic film 107, and thus densities the deposited fluorine-containing organic film 107.

Table 1 below shows the relationships of various gases with the atmospheric life and the $GWP_{100}$ (value obtained by quantifying the warming ability over 100 years of a gas with respect to that of carbon dioxide as 1).

TABLE 1

| Kind of gas | Formula | Atmospheric life (year) | $GWP_{100}$ |
| --- | --- | --- | --- |
| Carbon dioxide | $CO_2$ | 170 | 1 |
| Tetrafluoromethane | $CF_4$ | 50000 | 6500 |
| Hexafluoroethane | $C_2F_6$ | 10000 | 9200 |
| Trifluoromethane | $CHF_3$ | 250 | 12100 |
| Octafluoropropane | $C_3F_8$ | 2600 | 7000 |
| Octafluorocyclobutane | $C_4F_8$ | 3200 | 8700 |
| Octafluorocyclopentene | $C_5F_8$ | 1 | 90 |
| Hexafluoropropene | $C_3F_6$ | less than 1 | less than 100 (estimation) |
| Hexafluoropropane | $C_4F_6$ | less than 1 | less than 100 (estimation) |

As is found from Table 1, $C_5F_8$ gas, $C_3F_6$ gas, and $C_4F_6$ gas are short in atmospheric life and small in $GWP_{100}$, and therefore do not easily cause global warming. For this reason, these gases are preferable to other perfluorocarbon gases.

Also, the fluorine-containing organic film 107 deposited using $C_5F_8$ gas, $C_3F_6$ gas, or $C_4F_6$ gas as a material gas contains a small amount of free fluorine atoms, compared with a fluorine-containing organic film deposited using any of other perfluorocarbon gases. Therefore, the fluorine-containing organic film 107 exhibits improved adhesion to the metal interconnections 106 and the first silicon oxide film 101.

As a material gas for depositing the fluorine-containing organic film 107, $C_5F_8$ gas is preferable to other perfluorocarbon gases such as $C_2F_6$ gas and $C_4F_8$ gas for the following reason. The fluorine-containing organic film deposited using $C_5F_8$ gas is small in relative dielectric constant compared with a fluorine-containing organic film deposited using any of other perfluorocarbon gases.

Figure 4:
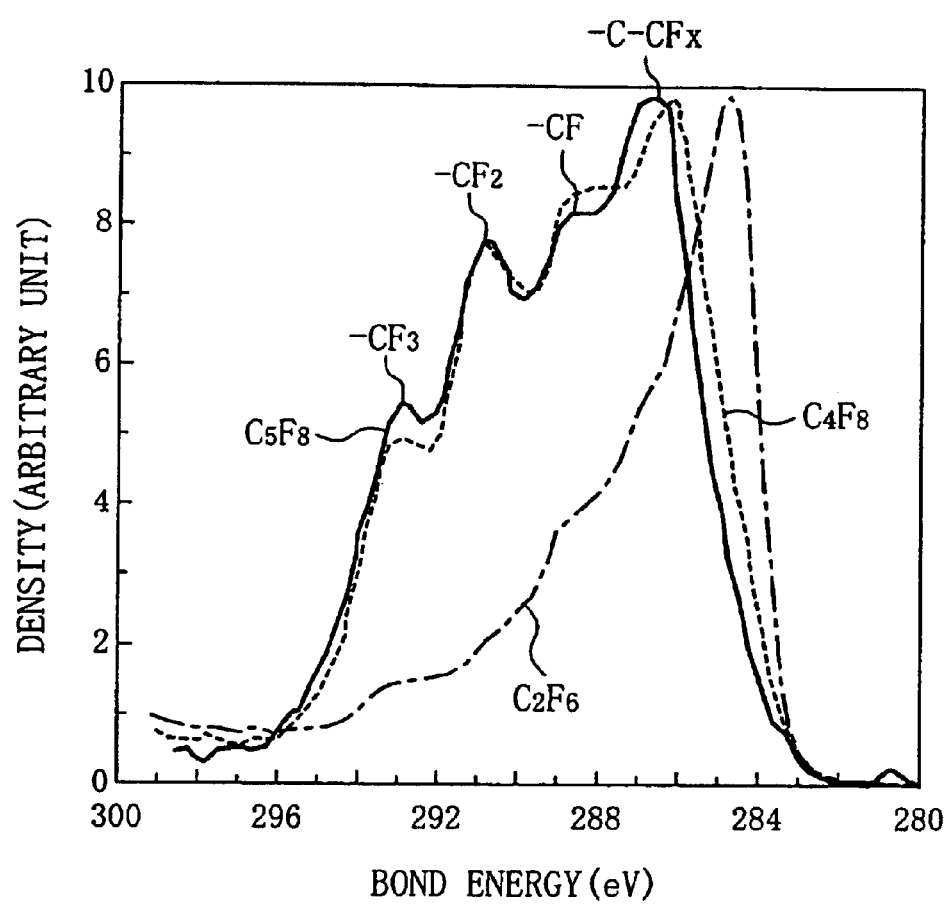
FIG. 4 is a view showing the XPS measurement results of fluorine-containing organic films deposited using $C_5F_8$ gas, $C_2F_6$ gas, and $C_4F_8$ gas.

FIG. 4 shows the results of XPS measurement of fluorine-containing organic films deposited using $C_5F_8$ gas, $C_2F_6$ gas, and $C_4F_8$ gas. From FIG. 4, it is confirmed that the amount of fluorine atoms contained in the fluorine-containing organic film deposited using $C_5F_8$ gas is larger than that in the fluorine-containing organic film deposited using $C_2F_6$ gas or $C_4F_9$ gas.

The reason why the number of fluorine atoms is large in the film formed using $C_5F_8$ gas is as follows. $C_5F_8$ gas has a large gas molecular weight. Therefore, when plasma is generated using $C_5F_8$ gas, the number of fluorine atoms in a $C_xF_y$ molecule constituting the resultant organic film is large.

For example, in comparison between $C_2F_6$ gas and $C_5F_8$ gas, $C_2F_6$ and $C_5F_8$ dissociate as follows.

$$C_2F_6 \rightarrow C_2F_5 \downarrow + F \uparrow$$
$$C_5F_8 \rightarrow C_5F_7 \downarrow + F \uparrow$$

$C_2F_5$ and $C_5F_7$ constitute organic films. Therefore, naturally, the film formed by deposition of $C_5F_7$ contains a larger amount of fluorine atoms than the film formed by deposition of $C_2F_5$.

Accordingly, the interlayer insulating film formed of the fluorine-containing organic film 107 deposited using $C_5F_8$ gas is smaller in capacitance between interconnections than an interlayer insulating film formed of a fluorine-containing organic film deposited using any of other perfluorocarbon gases. This reduces wiring delay at the metal interconnections 106.

In the process of densifying the fluorine-containing organic film 107, plasma of argon gas was used. Alternatively, plasma of another rare gas such as helium gas may be used. Since plasma of a rare gas does not chemically react with the fluorine-containing organic film 107, the fluorine-containing organic film 107 is prevented from change in properties. Helium gas is higher in thermal conductivity than argon gas. Therefore, if helium gas is used, the temperature of the fluorine-containing organic film 107 rapidly rises and thus the fluorine-containing organic film 107 is rapidly densified.

What is claimed is:

1. A method for fabricating a semiconductor device, comprising the steps of:

depositing a fluorine-containing organic film on a semiconductor substrate using a material gas containing fluorocarbon as a main component in a reactor chamber of a plasma processing apparatus;

after the depositing step, directly introducing a rare gas including no fluorocarbon into the reactor chamber, in which the semiconductor substrate is provided, to generate a plasma of the rare gas in the reactor chamber; and densifying the fluorine-containing organic film by directly exposing the fluorine-containing organic film to the plasma thereby heating the fluorine-containing organic film in the same reactor chamber, wherein the fluorocarbon is $C_5F_8$, $C_3F_6$, or $C_4F_6$.

2. The method for fabricating a semiconductor device of claim 1, wherein the step of depositing a fluorine-containing organic film includes the step of depositing the fluorine-containing organic film while cooling the semiconductor substrate.

3. The method for fabricating a semiconductor device of claim 1, wherein the step of densifying the fluorine-containing organic film includes the step of exposing the fluorine-containing organic film to the plasma of a rare gas in a state where the semiconductor substrate has moved toward a plasma generation region in the reactor chamber.

4. The method for fabricating a semiconductor device of claim 1, wherein the rare gas is Argon gas.

5. A method for fabricating a semiconductor device comprising the steps of:

forming a mask pattern made of a resist film or an insulating film on a metal film deposited on a semiconductor substrate;

dry-etching the metal film using the mask pattern to form a plurality of metal interconnections made of the metal film;

depositing an interlayer insulating film made of a fluorine-containing organic film between the plurality of metal interconnections and on top surfaces of the metal interconnections using a material gas containing fluorocarbon as a main component in a reactor chamber of a plasma processing apparatus; and after the depositing step, directly introducing a rare gas including no fluorocarbon into the reactor chamber, in which the semiconductor substrate is provided, to generate a plasma of the rare gas in the reactor chamber; and densifying the fluorine-containing organic film by directly exposing the fluorine-containing organic film to the plasma thereby heating the fluorine-containing organic film in the same reactor chamber, wherein the fluorocarbon is $C_5F_8$, $C_3F_6$, or $C_4F_6$.

6. The method for fabricating a semiconductor device of claim 5, wherein the step of forming a mask pattern includes the steps of:

depositing the insulating film on the metal film;

forming a resist pattern on the insulating film; and dry-etching the insulating film using the resist pattern to form the mask pattern, and the step of dry-etching the insulating film is performed in the same reactor chamber.

7. The method for fabricating a semiconductor device of claim 5, wherein the rare gas is argon gas.

* * * * *

UNITED STATES PATENT AND TRADEMARK OFFICE
CERTIFICATE OF CORRECTION

PATENT NO.     : 6,787,445 B1
DATED          : September 7, 2004
INVENTOR(S)    : Nobuhiro Jiwari et al.

Page 1 of 1

It is certified that error appeals in the above-identified patent and that said Letters Patent is hereby corrected as shown below:

Title page,
Item [73], Assignee, "Industry" should be -- Industrial --

Column 8,
Line 24, "Argon" should read -- argon --

Signed and Sealed this

Third Day of May, 2005

JON W. DUDAS
*Director of the United States Patent and Trademark Office*